(12) United States Patent
Vethake et al.

(10) Patent No.: US 11,152,766 B2
(45) Date of Patent: Oct. 19, 2021

(54) LOW CURRENT, HIGH POWER LASER DIODE BAR

(71) Applicant: Trumpf Photonics, Inc., Cranbury, NJ (US)

(72) Inventors: Thilo Vethake, Cranbury, NJ (US); Stefan Heinemann, Hightstown, NJ (US); Suhit Ranjan Das, West Windsor, NJ (US)

(73) Assignee: Trumpf Photonics, Inc., Cranbury, NJ (US)

( * ) Notice: Subject to any disclaimer, the term of this patent is extended or adjusted under 35 U.S.C. 154(b) by 0 days.

(21) Appl. No.: 16/410,451

(22) Filed: May 13, 2019

(65) Prior Publication Data

US 2019/0348816 A1 Nov. 14, 2019

Related U.S. Application Data

(60) Provisional application No. 62/671,169, filed on May 14, 2018.

(51) Int. Cl.
*H01S 5/40* (2006.01)
*G02B 19/00* (2006.01)
(Continued)

(52) U.S. Cl.
CPC ........ *H01S 5/4025* (2013.01); *G02B 19/0057* (2013.01); *H01S 5/04256* (2019.08);
(Continued)

(58) Field of Classification Search
CPC ............ H01S 5/04256; H01S 5/04257; H01S 5/4018; H01S 5/4025; H01S 5/4031
See application file for complete search history.

(56) References Cited

U.S. PATENT DOCUMENTS 4,546,480 A * 10/1985 Burnham ................ H01L 27/15
257/185
5,887,012 A 3/1999 Yamada
(Continued)

FOREIGN PATENT DOCUMENTS

CN 204167680 U 2/2015

OTHER PUBLICATIONS

PCT International Search Report and Written Opinion in International Appln. No. PCT/US2019/032036, dated Aug. 23, 2019, 12 pages.

*Primary Examiner* — Michael Carter
(74) *Attorney, Agent, or Firm* — Fish & Richardson P.C.

(57) ABSTRACT

A laser diode bar: includes a semiconductor substrate comprising a first semiconductor layer of a first conductivity type; a first laser diode stack on an upper side of the semiconductor layer; a second laser diode stack on the upper side of the semiconductor layer, the second laser diode stack being electrically connected in series with the first laser diode stack, in which an electrical conductivity of the first semiconductor layer of the first conductivity type is higher than an electrical conductivity of each semiconductor layer of the first and second laser diode stacks; and a first electrode layer on the first laser diode stack, in which the first electrode layer electrically connects the first laser diode stack to a portion of the first semiconductor layer of the first conductivity type that is between the first laser diode stack and the second laser diode stack.

27 Claims, 4 Drawing Sheets

(51) Int. Cl.
*H01S 5/32* (2006.01)
*H01S 5/042* (2006.01)

(52) U.S. Cl.
CPC ........ *H01S 5/04257* (2019.08); *H01S 5/3211* (2013.01); *H01S 5/4018* (2013.01); *H01S 5/4031* (2013.01)

(56) References Cited

U.S. PATENT DOCUMENTS

| | | |
|---|---|---|
| 6,829,278 B1 | 12/2004 | Allenson et al. |
| 9,246,305 B1* | 1/2016 | Kub .................... H01S 5/02484 |
| 10,199,794 B1* | 2/2019 | Yuen ..................... H01S 5/0218 |
| 2002/0075922 A1* | 6/2002 | Yoo .................... H01S 5/18308 |
| | | 372/45.013 |
| 2005/0225973 A1 | 10/2005 | Eliashevich et al. |
| 2011/0310915 A1* | 12/2011 | Capasso ................ B82Y 20/00 |
| | | 372/19 |
| 2012/0121297 A1* | 5/2012 | Jikutani ................ B82Y 20/00 |
| | | 399/221 |
| 2013/0070800 A1 | 3/2013 | Pfeiffer et al. |
| 2013/0234111 A1 | 9/2013 | Pfister et al. |
| 2013/0240923 A1 | 9/2013 | Hsu et al. |
| 2015/0129901 A1 | 5/2015 | Hoppel et al. |
| 2015/0333482 A1* | 11/2015 | Briggs .................. H01S 5/3402 |
| | | 372/45.01 |
| 2018/0034243 A1* | 2/2018 | Kelemen ............. H01S 5/04257 |
| 2018/0261980 A1* | 9/2018 | Katsuyama ......... H01S 5/04257 |

\* cited by examiner

LOW CURRENT, HIGH POWER LASER DIODE BAR

CROSS-REFERENCE TO RELATED APPLICATIONS

The present disclosure is related to, and claims benefit of, U.S. Provisional Patent Application No. 62/671,169, titled "Low Current, High Power Laser Diode Bar," which was filed on May 14, 2018, the entire contents of which are incorporated by reference into the present disclosure.

BACKGROUND

A laser diode bar is a device for providing a laser output, in which the device includes at least a one-dimensional array of individual semiconductor laser diodes. A typical laser diode bar for high-power applications may include, e.g., 10-50 laser diodes, each of which has an emitter width of between, e.g., 40-500 microns and a resonator length of between, e.g., 500-10000 microns. Power requirements of individual high-power laser diode bars are reaching upwards of 1000 W. Such high power may necessitate drive currents of 1000 A or more. Given that Joule heating scales quadratically with diode current, laser diodes experience significant heat dissipation, which can substantially degrade device performance and efficiency.

SUMMARY

The present disclosure relates to low current, high power laser diode bars and methods of making the same.

In general, in some aspects, the subject matter of the present disclosure is embodied in a high power laser diode bar that includes: a semiconductor substrate including a first semiconductor layer of a first conductivity type; a first laser diode stack on a front side of the semiconductor layer; a second laser diode stack on the front side of the semiconductor layer, the second laser diode stack being electrically connected in series with the first laser diode stack, in which each of the first laser diode stack and the second laser diode stack includes one or more semiconductor cladding layers of the first conductivity type, and in which an electrical conductivity of the first semiconductor layer of the first conductivity type is higher than an electrical conductivity of each semiconductor cladding layer of the first conductivity type; and a first electrode layer on the first laser diode stack, in which the first electrode layer electrically connects the first laser diode stack to a portion of the first semiconductor layer of the first conductivity type that is between the first laser diode stack and the second laser diode stack.

Implementations of the high power laser diode bar can include one or more of the following features. For example, in some implementations, the laser diode bar includes: a trench between the first laser diode stack and the second laser diode stack; and a dielectric layer on both the first laser diode stack and the second laser diode stack, the dielectric layer extending into the trench, in which the first electrode layer electrically connects to the first laser diode stack through a first opening in the dielectric layer, and electrically connects to the first semiconductor layer of the first conductivity type through a second opening in the dielectric layer. The trench may extend into the first semiconductor layer of the first conductivity type. The substrate may include a semi-insulating semiconductor region beneath the first semiconductor layer of the first conductivity type, and the trench extends into the semi-insulating region.

In some implementations, the first electrode layer includes an ohmic contact with the first laser diode stack and an ohmic contact with the first semiconductor layer of the first conductivity type.

In some implementations, the first semiconductor layer of the first conductivity type and each layer within each semiconductor cladding region are doped with a first dopant type, and a concentration of the first dopant type in the first semiconductor layer is greater than a concentration of the first dopant type in each layer of each semiconductor cladding region. The concentration of the first dopant type in the first semiconductor layer may be greater than $1*10^{18}$ cm$^{-3}$.

In some implementations, a resistance of the first semiconductor layer is less than 10 milli-ohms.

In some implementations, the first electrode layer electrically connects an anode of the first laser diode stack to a cathode of the second laser diode stack.

In some implementations, each laser diode stack includes: a second cladding layer of a second conductivity type; and a semiconductor active region for generating photons, in which the semiconductor active region is between the first cladding layer of the first conductivity type and the second cladding layer of the second conductivity type, and in which the first electrode layer is on and electrically connects to the second cladding layer in the first laser diode stack.

In some implementations, the high power laser diode includes a shunt electrode layer on a back side of the first semiconductor layer of the first conductivity type and directly underneath the first laser diode stack. The laser diode bar may include a first recess in the semiconductor substrate, in which the shunt electrode layer is within the first recess. The first recess may extend from a back side of the semiconductor substrate to the back side of the first semiconductor layer. The laser diode bar may include a second electrode layer in direct physical and electrical contact with the front side of the first semiconductor layer of the first conductivity type, in which at least a portion of the shunt electrode layer is directly beneath the second electrode layer. The laser diode bar may include a dielectric layer extending over a sidewall of the first laser diode stack, in which the dielectric layer is between the first laser diode stack and the second electrode layer. The second electrode layer may provide an ohmic contact with the front side of the first semiconductor layer of the first conductivity type.

In general, in some aspects, the subject matter of the present disclosure may be embodied in a method of fabricating a laser diode bar, in which the method includes: providing a semiconductor substrate; forming a first semiconductor layer of a first conductivity type on the semiconductor substrate; forming a semiconductor stack on a front side of the first semiconductor layer, in which the semiconductor stack includes at least one first semiconductor cladding layer of the first conductivity type on the first semiconductor layer, and an electrical conductivity of the first semiconductor layer is greater than an electrical conductivity of each first semiconductor cladding layer; forming a trench in the semiconductor stack down to the first semiconductor layer to divide the semiconductor stack into a first laser diode stack and a second laser diode stack; and forming a first electrode layer on the first laser diode stack and on the first semiconductor layer in the trench to establish a series connection between the first laser diode stack and the second laser diode stack.

Implementations of the method may include one or more of the following features. For example, in some implementations, the first semiconductor layer of the first conductivity type and each layer within each semiconductor cladding region are doped with a first dopant type, in which a concentration of the first dopant type in the first semiconductor layer is greater than a concentration of the first dopant type in each layer of each semiconductor cladding region. The concentration of the first dopant type in the first semiconductor layer may be greater than $1*10^{18}$ cm$^{-3}$. A resistance of the first semiconductor layer may be less than 10 milli-ohms.

In some implementations, the method may include: forming a dielectric layer on the first laser diode stack and on the first semiconductor layer in the trench prior to forming the first electrode layer; and forming a first opening in the dielectric layer to expose the first laser diode stack; and forming a second opening in the dielectric layer to expose the first semiconductor layer in the trench, in which forming the electrode layer comprises forming the electrode layer in the first opening and in the second opening.

In some implementations, the trench extends into the semiconductor substrate.

In some implementations, the semiconductor stack includes: a semiconductor active region for generating photons on at least one first semiconductor cladding layer; and at least one second semiconductor cladding layer of a second conductivity type on the semiconductor active region.

In some implementations, the method includes forming a backside recess in the semiconductor substrate, in which the backside recess extends to the first semiconductor layer and is directly beneath the first laser diode stack. The method may include forming a second electrode layer in the recess and directly beneath the first laser diode stack. The method may include forming a third electrode layer in direct physical and electrical contact with the front side of the first semiconductor layer of the first conductivity type, in which at least a portion of the second electrode layer is directly beneath the third electrode layer.

In general, in some aspects, the subject matter of the present disclosure is embodied in a laser diode bar including: a semiconductor substrate including a first semiconductor layer doped with a first conductivity type; multiple additional semiconductor layers on the front surface of the first semiconductor layer, the multiple additional semiconductor layers including a first cladding layer doped with the first conductivity type, an active region for generating photons, and a second cladding layer doped with a second conductivity type; multiple trenches in the additional semiconductor layers and separating the additional semiconductor layers into multiple laser diode stacks, in which the first semiconductor layer is a common cathode contact for each laser diode stack; multiple electrically insulating barriers, in which each electrically insulating barrier is positioned in the first semiconductor layer between a different pair of laser diode stacks, and in which the multiple laser diode stacks are serially electrically connected. In some implementations, each trench may include a first depth extending from an upper surface of the additional semiconductor layers to the upper surface of the first semiconductor layer and a second depth extending from the upper surface of the additional semiconductor layers into the semiconductor substrate. In some implementations, the laser diode bar further includes: multiple dielectric layers, each dielectric layer arranged on the upper surface of a corresponding laser diode stack; a contact opening in each dielectric layer; and multiple laser diode anode contacts, in which each anode contact is positioned in a corresponding contact opening.

Implementations may have one or more of the following advantages. For example, in some implementations, the laser diodes of a high-power laser diode bar are connected in series, thus limiting the maximum current of the laser diode bar to no more than the drive current of an individual laser diode, which can aid in reducing current requirements, as well as Joule heating. In some implementations, the presence of a high conductivity semiconductor layer beneath the laser diode stack reduces the serial resistance, and thus further reduce the Joule heating. In some implementations, the presence of a shunt electrode on a backside surface of a high conductivity semiconductor layer beneath a laser diode stack can further reduce the resistance of the laser diode. Furthermore, the shunt electrode may be positioned within a backside recess that aids in reducing leakage currents between adjacent laser diodes. In some implementations, a portion of the shunt electrode may be located directly beneath a portion of a cathode contact, which further reduces the series resistance by reducing lateral current pathways.

The details of one or more embodiments of the invention are set forth in the accompanying drawings and the description below. Other features and advantages of the invention will be apparent from the description, drawings, and claims.

DETAILED DESCRIPTION

Increasing drive currents for high-power laser diode bars are due, at least in part, to their configuration, in which the individual laser diodes within the laser diode bar are electrically connected to one another in parallel. Given that the overall laser diode bar drive current corresponds to the sum of drive currents across each individual diode, increasing the number of individual diodes within the bar adds to the overall current. Similarly, when the current driving capacity of individual diodes increases, the maximum overall current of the laser diode bar also rises.

The present disclosure is directed to laser diode bar configurations that facilitate a reduction in overall current by connecting the individual laser diodes in series. In a serial configuration, the overall laser diode bar drive current is limited by the laser diode within the bar having the smallest current driving capacity. As a result, it may be possible to achieve a substantial decrease in the maximum current required by the laser diode bar. Furthermore, in certain implementations, the laser diode bar configurations according to the present disclosure are capable of reducing series resistance associated with each individual laser diode, leading to further reduction in Joule heating and improved device performance.

Figure 1A:
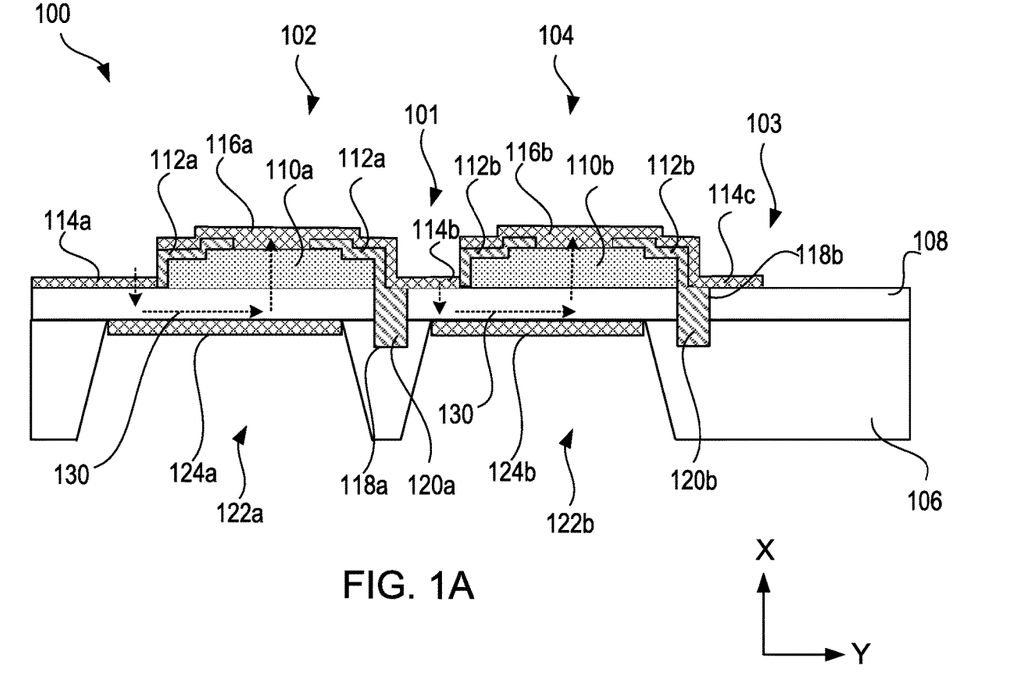
FIG. 1A is a schematic of an example of a semiconductor laser diode bar including multiple laser diodes electrically connected in series.

FIG. 1A is a schematic of an example of a semiconductor laser diode bar 100 according to the present disclosure. The laser diode bar 100 includes a first semiconductor laser diode 102 and a second semiconductor laser diode 104 electrically connected in series with one another. The view of the laser diode bar 100 illustrated in FIG. 1A corresponds to a cross-section along a plane extending through a width of each individual laser diode (i.e., along the Y-axis). The length and optical axis of each individual laser diode are defined along the Z-axis, which extends into and out of the page of FIG. 1A, whereas a height of each individual laser diode extends along the X-axis. Though only two laser diodes are shown in FIG. 1A, additional laser diodes may be included. For example, a laser diode bar can include, but is not limited to, 10, 20, 30, 40, 50, or 100 laser diodes.

Laser diode bar 100 further includes a semiconductor substrate 106. Semiconductor substrate 106 can include, but is not limited to, a semi-insulating semiconductor substrate such as a portion of an intrinsically (unintentionally) doped semiconductor wafer. For example, substrate 106 can include an intrinsic single crystalline GaAs wafer. Other substrate materials also may be used. The semi-insulating substrate 106 may have a resistivity between, e.g., about $10^7$ $\Omega$*cm to about $10^9$ $\Omega$*cm. A thickness of the substrate 106 may be in the range of, e.g., about 100 microns to about 750 microns.

Semiconductor substrate 106 includes a first semiconductor layer 108. First semiconductor layer 108 is a highly doped semiconductor layer that provides a low resistance, high conductivity current path for each laser diode. For example, first semiconductor layer 108 can include an N+ or N++ type GaAs layer doped with an N-type dopant, such as silicon, germanium, tin, tellurium, or sulphur. First semiconductor layer 108 alternatively can include, e.g., a P+ or P++ type GaAs layer doped with a P-type dopant, such as beryllium, zinc or carbon. Other materials and dopants are also possible. The first semiconductor layer 108 may be formed by doping the semiconductor substrate 106 (e.g., through ion implantation) or as a separate deposited layer (e.g., through epitaxial growth). A thickness of the first semiconductor layer may be in the range of, e.g., about 100 nm to about 10 microns, including between about 100 nm to about 1000 nm, or between about 100 nm to about 500 nm.

First laser diode 102 includes a first laser diode stack 110a formed on a front side or top surface of the first semiconductor layer 108. Similarly, second laser diode 104 includes a second laser diode stack 110b also formed on the front side or top surface of the first semiconductor layer 108. The second laser diode stack 110b is spaced apart from the first laser diode stack 110a by a trench 101. Laser diode stacks 110a and 110b include multiple layers of semiconductor material configured to provide laser diodes each including an active region in which photons are generated and guided by waveguiding/cladding regions.

Figure 1B:
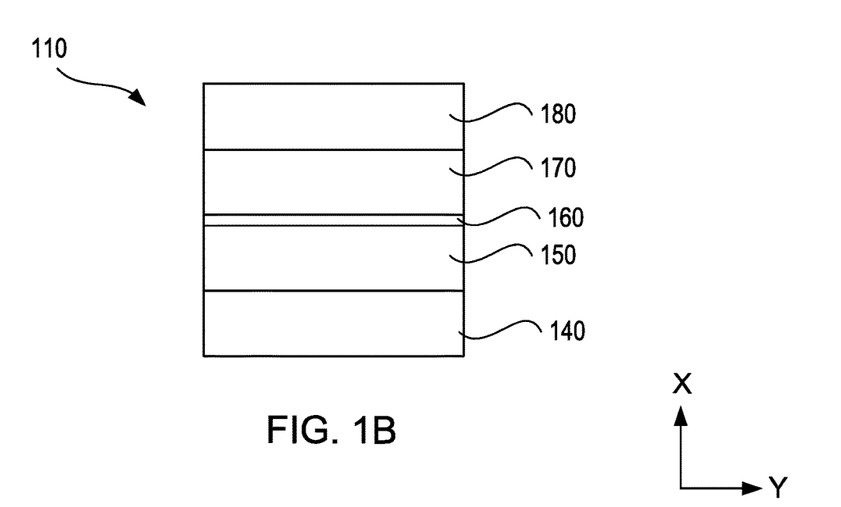
FIG. 1B is a schematic illustrating a side view of an example of a laser diode stack.

FIG. 1B is a schematic illustrating a side view of an example of a laser diode stack 110 that may be used for stacks 110a, 110b. As shown in FIG. 1B, the stack 110 includes: a first semiconductor cladding region 140 of a first conductivity type; a first semiconductor waveguide region 150 on the first semiconductor cladding region 140; a semiconductor active region 160 for generating photons on the first waveguide region 150; a second waveguide region 170 on the semiconductor active region 160; and a second semiconductor cladding region 180 of a second conductivity type on the second waveguide region 170.

The laser diode stack structure 110 shown in FIG. 1B may be referred to as a separate confinement heterostructure (SCH). In a SCH, the central semiconductor active region 160 that generates photons is flanked by upper and lower layers having a lower refractive index. Because the central semiconductor active region 160 has a higher refractive index than its surrounding layers, light is therefore primarily confined to the active region 160 or "core" of the structure, where optical gain is produced. This arrangement guides the optical mode along the active region core, creating a laser light beam that is emitted from a facet of the structure (e.g., along the Z-axis direction into or out of the page in FIGS. 1A and 1B).

The semiconductor active region 160 includes a single quantum well or multiple stacked quantum wells, though other active region structures are also possible. The semiconductor active region 160 may be formed from various different materials, such as InGaAs, InGaAsP, AlGaAs, AlGaInP, or InGaN, among others.

The first cladding region 140 and the first waveguide region 150 are formed from semiconductor materials of a first conductivity type (e.g., a P-type semiconductor or an N-type semiconductor), whereas the second waveguide region 170 and the second cladding region 180 are formed from semiconductor materials of a second conductivity type that is different from the first conductivity type of the first cladding region 140 and the first waveguide region 150. For instance, the first cladding region 140 and the first waveguide region 150 may be doped N-type whereas the second waveguide region 170 and the second cladding region 180 may be doped P-type. Examples of materials that may form the first and second cladding regions 140, 180 and the first and second optical waveguide regions 150, 170 include AlGaAs, GaN, InP or SiC, among others. In the case of GaAs, an example of an N-type dopant includes Si, whereas an example of a P-type dopant includes C. Dopants for waveguide/cladding materials other than GaAs include, e.g., silicon (N-type for GaN), magnesium (P-type for GaN), nitrogen (N-type for SiC), aluminum (P-type for SiC). In some implementations, one or more layers within the waveguide regions 150, 170 and/or within the cladding regions 140, 180 are intrinsic (unintentionally doped). In general, the doping concentration (and thus conductivity) of the cladding and waveguide regions extends from higher values further away from the semiconductor active region 160 toward lower values closer to the semiconductor active region 160.

The first semiconductor cladding region 140 is formed directly on the top or upper surface of the first semiconductor layer 108. Both the first semiconductor cladding region 140 and the first semiconductor layer 108 have the same conductivity type. For example, if the first semiconductor layer 108 is an N-type layer, then the first semiconductor cladding region 140 also is N-type. In some implementations, each of the first and second cladding regions 140, 180 include more than one semiconductor layer.

Referring again to FIG. 1A, each of laser diode 102 and laser diode 104 includes a corresponding upper electrode layer formed on the laser diode stack. For example, laser diode 102 includes a first upper electrode layer 116a formed on a top or upper surface of laser diode stack 110a. First upper electrode layer 116a provides an electrical connection to the anode of laser diode 102. Similarly, second laser diode 104 includes a second upper electrode layer 116b formed on the second laser diode stack 110b. Second upper electrode layer 116b provides an electrical connection to the anode of laser diode 104.

As shown in FIG. 1A, the first upper electrode layer 116a extends from the top surface of the laser diode stack 110a into the trench area 101 between the first laser diode 102 and the second laser diode 104, where the first upper electrode layer 116a is in contact (e.g., direct physical contact) with the first semiconductor layer 108. The first upper electrode layer 116a thus provides an electrical connection from the anode of first diode 102 to the first semiconductor layer 108. The portion 114b of the upper electrode layer 116a that is in contact with the first semiconductor layer 108 may be understood to be a cathode contact of the second laser diode 104, whereas the portion of the upper electrode layer 116a that is in contact with the first laser diode stack 110a may be understood to be an anode contact of the first laser diode 102. Accordingly, the first upper electrode layer 116a may provide an electrical connection (e.g., a series electrical connection) from the anode of first laser diode 102 to a cathode of a second laser diode 104. In implementations when a metal is used for the upper electrode layer 116a, the metal is selected to provide an ohmic contact for both the anode and cathode contacts. For example, if the first semiconductor layer 108 is GaAs, then metal of the upper electrode layer 116a may be selected to include one or more of Au, Pt, Ti, Al, or TiW.

To prevent the first upper electrode layer 116a from creating a short circuit across the layers of the laser diode stack 110a, a first upper dielectric layer 112a is formed on a sidewall of the laser diode stack 110a between the stack 110a and the first upper electrode layer 116a. The first upper dielectric layer 112a electrically insulates the laser diode stack 110a from the first upper electrode layer 116a. The first upper dielectric layer 112a may include a material such as, e.g., silicon oxide or silicon nitride. The first upper dielectric layer 112a may have a thickness in the range of, e.g., about 50 nm to about 500 nm. In some implementations, a window or contact opening is formed within the first upper dielectric layer 112a to allow the first upper electrode layer 116a to make electrical contact with the laser diode stack 110a.

Similar to the first laser diode 102, the second laser diode 104 also includes an upper electrode such as second electrode layer 116b. Second upper electrode layer 116b extends from the top surface of the second laser diode stack 110b into another trench area 103 located to the right of stack 110b in FIG. 1A. In some implementations, the trench 103 serves to space the second laser diode stack 110b apart from a laser diode stack of a third laser diode formed as part of laser diode bar 100. In the second trench region 103, the second upper electrode layer 116b is in direct contact with the first semiconductor layer 108 and, in some implementations, forms a cathode contact 114c of a third laser diode. Accordingly, the second upper electrode layer 116b may provide an electrical connection (e.g., a series electrical connection) from the anode of second laser diode 104 to a cathode of a third laser diode. In implementations when a metal is used for the upper electrode layer 116b, the metal is selected to provide an ohmic contact for both the anode and cathode contacts. For example, if the first semiconductor layer 108 is GaAs, then metal of the upper electrode layer 116b may be selected to include one or more of Au, Pt, Ti, Al, or TiW.

To prevent the second upper electrode layer 116b from creating a short circuit across the layers of the laser diode stack 110b, a second upper dielectric layer 112b is formed on a sidewall of the laser diode stack 110b between the stack 110b and the second upper electrode layer 116b. The second upper dielectric layer 112b electrically insulates the laser diode stack 110b from the second upper electrode layer 116b. The second upper dielectric layer 112b may include a material such as, e.g., silicon oxide or silicon nitride. The second upper dielectric layer 112b may have a thickness in the range of, e.g., about 50 nm to about 500 nm. In some implementations, a window is formed within the second upper dielectric layer 112b to allow the second upper electrode layer 116b to make electrical contact with the laser diode stack 110b.

A cathode contact 114a for the first laser diode 102 is formed on a top or upper surface of the first semiconductor layer 108 and to the left of laser diode stack 110a as shown in FIG. 1A. Similar to cathode contacts 114b and 114c, the cathode contact 114a may be formed in a trench that separates the laser diode stack of the first laser diode 102 from a laser diode stack of a directly adjacent laser diode. In some implementations, the cathode contact 114a may be separated from making direct physical contact with the laser diode stack 110a by a portion of the upper dielectric layer 112a that is formed on a sidewall of the stack 110a. Similarly, the cathode contact 114b may be separated from making direct physical contact with the laser diode stack 110b by a portion of the second upper dielectric layer 112b that is formed on a sidewall of the stack 110b.

During operation of the laser diode bar 100, each laser diode 102, 104 is subjected to a forward bias so that photons are generated within the active regions 160 of their respective laser diode stacks and optically amplified through stimulated emission. The dashed line arrows 130 indicate an example of current flow (e.g., electron flow) direction under forward bias operation of the laser diodes 102, 104. In the example of FIG. 1A, the arrows 130 show that current flows a) from the cathode contact 114a of the first laser diode 102 through the highly conductive first semiconductor layer 108, b) from the highly conductive first semiconductor layer 108 through the laser diode stack 110a to the first upper electrode layer 116a, c) from the first upper electrode layer 116a back to the highly conductive first semiconductor layer 108 (at cathode contact 114b), and d) from the highly conductive first semiconductor layer 108 through the laser diode stack 110b to the second upper electrode layer 116b of the second laser diode 104. As illustrated by the current pathway 130, the first laser diode 102 and second laser diode 104 are electrically connected in series. In contrast to a high-power laser diode bar having the individual diodes connected in parallel, the series connection thus limits the maximum overall current consumption of the bar 100 to the laser diode with the lowest drive current. By reducing the current consumed by bar 100, Joule heating, which is proportional to the current squared, also may be substantially diminished.

Joule heating can be further reduced by decreasing the series resistance associated with the current pathway through the series-connected diodes. The first semiconductor layer 108 may be heavily doped to provide a low resistivity pathway between the cathode contact and the laser diode stack of each laser diode. For example, a first semiconductor layer 108 formed of GaAs may be doped N-type with Si having a doping density between about $0.8*10^{18}/cm^3$ to about $5.0*10^{19}/cm^3$. In some implementations, the concentration of the dopant in the first semiconductor layer 108 is greater than a concentration of the dopant in each layer of the first semiconductor cladding region 140 and/or of waveguide region 150 of each laser diode stack 110 within the laser diode bar 100. The heavy doping may provide the first semiconductor layer 108 with a resistivity between, e.g., about $10^{-3}$ Ω*cm to about $10^{-5}$ Ω*cm. In some implementations, the conductivity of the first semiconductor layer 108 is greater than a conductivity of each layer of the first semiconductor cladding region 140 and/or of the waveguide region 150 of each laser diode stack 110 within the laser diode bar 100. Alternatively or in addition, the first semiconductor layer 108 may be heavily doped so that it exhibits a series resistance along the current pathway through the first semiconductor layer of, e.g., no more than about 0.5 mΩ, no more than about 1 mΩ, no more than about 5 mΩ, no more than about 10 mΩ, no more than about 20 mΩ, no more than about 50 mΩ, or no more than about 100 mΩ. In some implementations, such as for high-power laser diode applications, the series resistance along the current pathway through the first semiconductor layer 108 should be far less than the resistance required (e.g., 50Ω or 75Ω) by laser diodes used in, e.g., telecommunications applications, where impedance matching is of importance. With the structure described herein, the first semiconductor layer 108 may therefore act as a common cathode contact for each laser diode of the laser diode bar 100. For instance, for the first laser diode 102, both portion 114a and first semiconductor layer 108 may act as a cathode contact. Similarly, for laser diode 104, both portion 114b and first semiconductor layer 108 may act as a cathode contact.

To prevent current from leaking across the first semiconductor layer 108 between the first laser diode 102 and the second laser diode 104, the trenches between the laser diode stacks (e.g., trenches 101 and 103) may extend into the first semiconductor layer 108. Additionally, in some implementations, the trench may even extend into the substrate 106 beneath the first semiconductor layer 108. For example, as shown in FIG. 1A, a portion 118a of trench 101 extends into the first semiconductor layer 108 and into the substrate 106. Thus, the depth of trench portion 118a may be greater than the depth of the portion of trench 101 that extends only to the upper surface of the first semiconductor layer 108. In some cases, portion 118a includes or is filled with a dielectric material 120a that acts as an electrical insulator to prevent current from the area of first semiconductor layer 108 located beneath first laser diode stack 110a leaking into the area of first semiconductor layer 108 located beneath the second laser diode stack 110b. The dielectric material 120a may also provide structural support to the overlying upper electrode layer 116a. Similarly, a portion 118b of trench 103 extends into the first semiconductor layer 108 and into the substrate 106 to the right of laser diode stack 110b. The portion 118b may include a dielectric material 120b to prevent current from the first semiconductor layer 108 underneath the second laser diode stack 110b from leaking into a region of the first semiconductor layer 108 on which another laser diode stack may be formed. In general, the dielectric that is formed within portions 118a, 118b may be the same as the dielectric that forms layers 112a, 112b. For example, the dielectric may include silicon oxide or silicon nitride.

In some implementations, additional modifications may be made to the laser diode bar to reduce series resistance. For instance, the bottom or backside of the first semiconductor layer 108 underneath each laser diode may optionally include a shunt electrode layer. As an example, FIG. 1A shows a first shunt electrode 124a arranged on a backside of the first semiconductor layer 108 and directly beneath the first laser diode stack 110a. FIG. 1A also shows a second shunt electrode 124b arranged on the backside of the first semiconductor layer 108 and directly beneath the second laser diode stack 110b. The shunt electrodes 124a and 124b do not directly physically contact one another. Each of the shunt electrodes 124a, 124b may include, e.g., a low resistivity metal that makes an ohmic contact with the first semiconductor layer 108. For example, if first semiconductor layer 108 is GaAs doped N-type, the shunt electrodes 124a, 124b may include one or more of a Au, Pt, Ti, Al, or TiW layer. During operation of the laser diode bar 100, the shunt electrodes 124a, 124b may be used to provide an even lower series resistance path for current to flow. For example, as electron current enters from the cathode 114a, the electrons preferentially flow across the thickness of the first semiconductor layer 108 to the shunt electrode 124a where the majority of current travels until again crossing the thickness of the first semiconductor layer 108 to the laser diode stack 110a. Compared to the highly doped first semiconductor layer 108, the shunt electrode 124a may provide a lower resistivity/higher conductivity current pathway. Similarly, the shunt electrode 124b provides a lower resistivity/higher conductivity current pathway from cathode 114b to the second laser diode stack 110b than the first semiconductor layer 108 alone.

In some implementations, the shunt electrodes are arranged relative to the cathode contacts to reduce the series resistance further. For example, as shown in FIG. 1A, at least a portion of the shunt electrode 124a is directly beneath a portion of the electrode layer that forms the cathode contact 114a so that the portions overlap one another (e.g., when viewed along the X-axis direction). Similarly, at least a portion of the shunt electrode 124b is directly beneath a portion of the electrode layer that forms cathode contact 114b so that the portions overlap one another. By forming the shunt electrodes directly beneath the cathode contacts, the resistance between the cathode contact and the shunt electrode is primarily defined by the thickness and conductivity of the first semiconductor layer 108 that is between the cathode contact and the shunt electrode. That is, the lateral migration of current between cathode contact and shunt electrode may be reduced.

In some implementations, the laser diode bar 100 may optionally include recesses within the semiconductor substrate 106, where the shunt electrodes are arranged within the recesses. For example, as shown in FIG. 1A, the substrate 106 includes a first recess 122a and a second recess 122b. The first shunt electrode 124a is positioned within the first recess 122a directly underneath the first laser diode stack 110a. The second shunt electrode 124b is positioned within the second recess 122b directly underneath the second laser diode stack 110b. In some implementations, the recesses 122a, 122b extend from a backside of the semiconductor substrate 106 to the backside of the first semiconductor layer 108. By forming the recesses 122a, 122b, it may be possible to further reduce the occurrence of leakage current within the laser diode bar 100. In particular, since a majority of the substrate 106 is removed, alternate pathways for current to flow (other than the desired pathway 130) are reduced.

FIGS. 2A-2H are schematics illustrating an example of a process for fabricating a laser diode bar that includes multiple laser diodes electrically connected in series. For ease of illustration, only a single diode is shown in FIGS. 2A-2H, though the process may be the same for each laser diode on the laser diode bar.

Figure 2A:
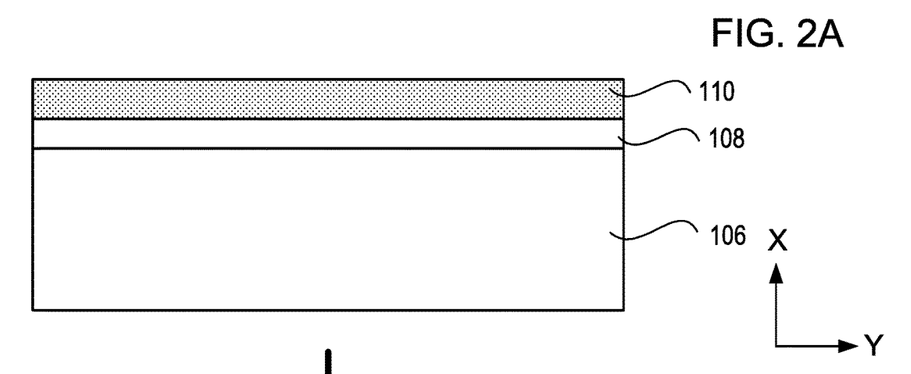
FIGS. 2A-2H are schematics illustrating an example of a process for fabricating a laser diode bar that includes multiple laser diodes electrically connected in series.

In a first step of the fabrication process shown in FIG. 2A, a semiconductor substrate 106 is provided. As explained herein, semiconductor 106 substrate may include, e.g., a semi-insulating substrate such as an intrinsic (undoped or unintentionally defect-doped) GaAs wafer. In other implementations, the substrate 106 may include, but is not limited to, SiC or InP. A first semiconductor layer 108 is formed on or as a part of semiconductor substrate 106. For example, in some implementations, an upper layer of the semiconductor substrate 106 is doped with a dopant so that the upper layer has a selected conductivity type (e.g., N-type). Alternatively, in some implementations, the first semiconductor layer is grown or deposited on the substrate 106 using, e.g., an epitaxial process. In some implementations, it is useful to ensure that the first semiconductor layer 108 is lattice-matched to the substrate 106 to reduce stress within the device that can adversely affect device performance.

On top of the first semiconductor layer 108, a laser diode stack 110 then is provided. The laser diode stack 110 is described herein with respect to FIG. 1B. As explained with respect to that example, the laser diode stack 110 may include a first and second cladding region, a first and second optical waveguide region, and an active region for generating photons when the laser diode is under forward bias. Each of the cladding regions, the optical waveguide regions, and the active regions may include one or more semiconductor layers. The layers of the laser diode stack may be grown or deposited through, e.g., an epitaxial process. The total number of layers within the laser diode stack, as well as the particular thickness of each layer within the laser diode stack may vary depending on the desired design of the laser diode.

Figure 2B:
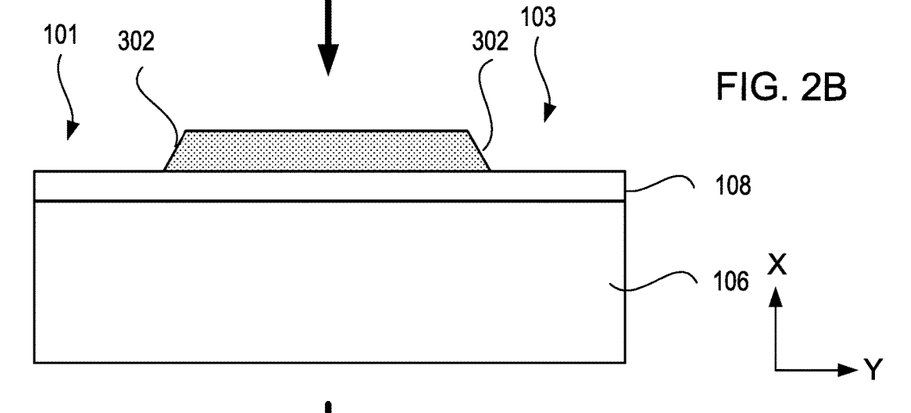

Following deposition of the laser diode stack, the laser diode stack then is etched as shown in FIG. 2B to form multiple trenches, such as trenches 101, 103. A trench may separate two adjacent laser diode stacks from one another. The trenches may be formed using wet or dry etch techniques. For example, a resist layer may first be formed on an upper surface of the laser diode stack 110. Selected portions of the resist layer then are exposed to light that causes the exposed portions to change their chemical structure. The resist then is subjected to a developer to remove either the exposed portions or unexposed portions of the resist and provide a patterned resist depending on the resist type. The patterned resist then is subjected to a wet or dry etch, such that the exposed portions of the first semiconductor layer are etched away, whereas the portions of the first semiconductor layer covered by the remaining resist are protected. In some implementations, the material that forms the first semiconductor layer is the same as the material that forms one or more layers of the laser diode stacks. Therefore, it may not be possible to use a selective etch that would otherwise stop based on a difference in material. Rather, the etch may be a timed-etch, in which the total etch time is determined based on the etch rate of the etchant, as well as the known thickness of the laser diode stack. In some cases, the etch process is not anisotropic, such that the trench is left with angled sidewalls, such as sidewalls 302.

Figure 2C:
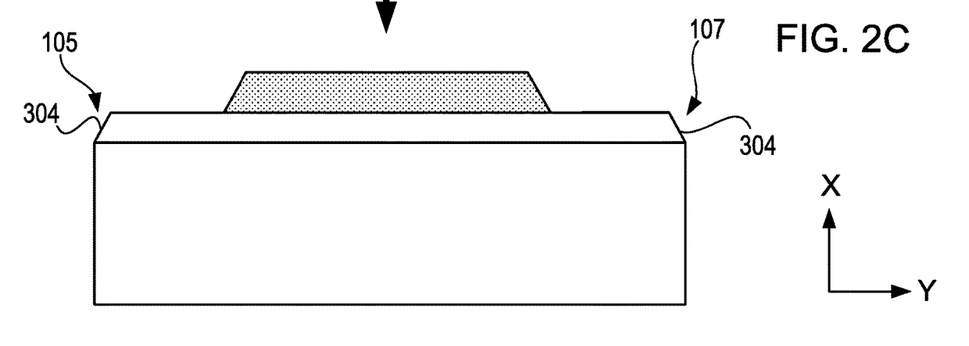

After forming the trench to form the separate laser diode stacks, the trench may be extended into the first semiconductor layer, as shown in FIG. 2C. This may entail simply continuing the etching process described above for a pre-determined length of time that ensures the etchant reaches into the first semiconductor layer 108. Alternatively, a second photolithography process may be performed to provide patterned resist that defines a different region of the first semiconductor layer 108 where the trench will be extended. Following the second photolithography process, the wet or dry etch may again be performed to create the extended trench region, such as extended trench regions 105, 107 shown in FIG. 2C. Again, the etch process does not have to be anisotropic, in which case the extended trenches may have angled sidewalls, such as sidewalls 304.

Figure 2D:
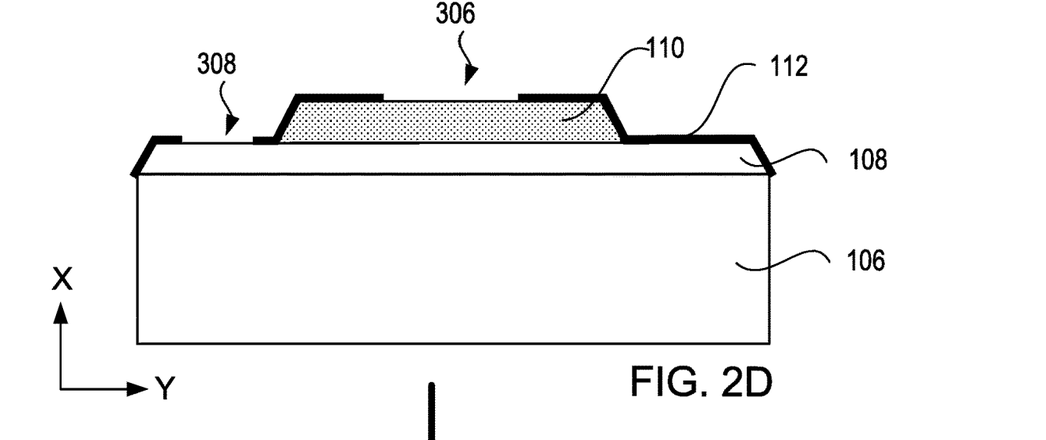

Following the formation of the trenches, the upper dielectric layer is formed on a surface of the laser diode stacks and the exposed portions of the first semiconductor layer and/or substrate. For example, as shown in FIG. 2D, a dielectric layer 112 is formed over laser diode stack 110. The dielectric layer may include insulating materials such as silicon oxide or silicon nitride. The thickness of the dielectric layer 112 may range, e.g., from about 50 nm to about 500 nm. Other thicknesses are also possible. The dielectric layer 112 may be deposited using a chemical vapor deposition process such as, e.g., plasma enhanced chemical vapor deposition. Physical vapor deposition processes or other deposition process are also possible. The dielectric layer 112 may be patterned to form windows or contact openings through which the upper electrode layer may be later deposited. For example, the dielectric layer 112 may be patterned to form a first window (e.g., an anode window) 306 on the laser diode stack 110. The dielectric layer 112 may also be patterned to form a second window (e.g., a cathode window) 308 on the first semiconductor layer 108. The process of patterning the dielectric layer 112 may include depositing and patterning a resist layer, followed by a wet or dry etch through the dielectric layer 112.

Figure 2E:
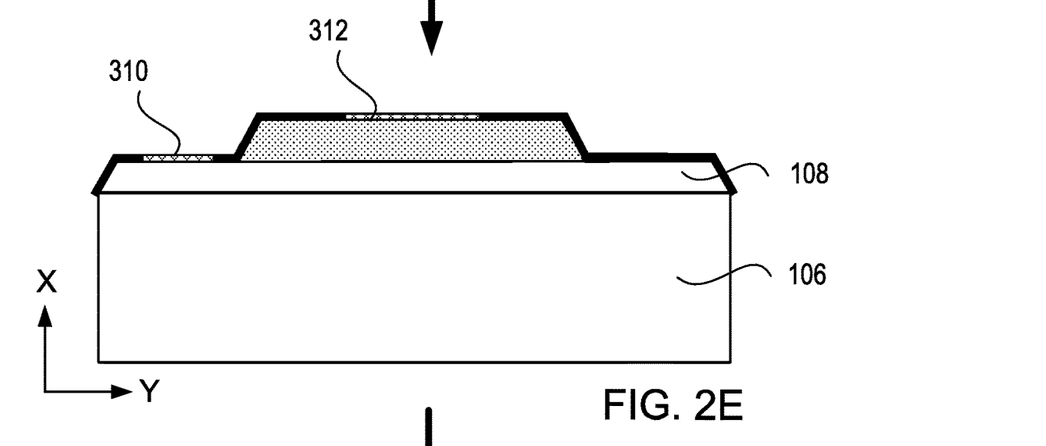
Figure 2F:
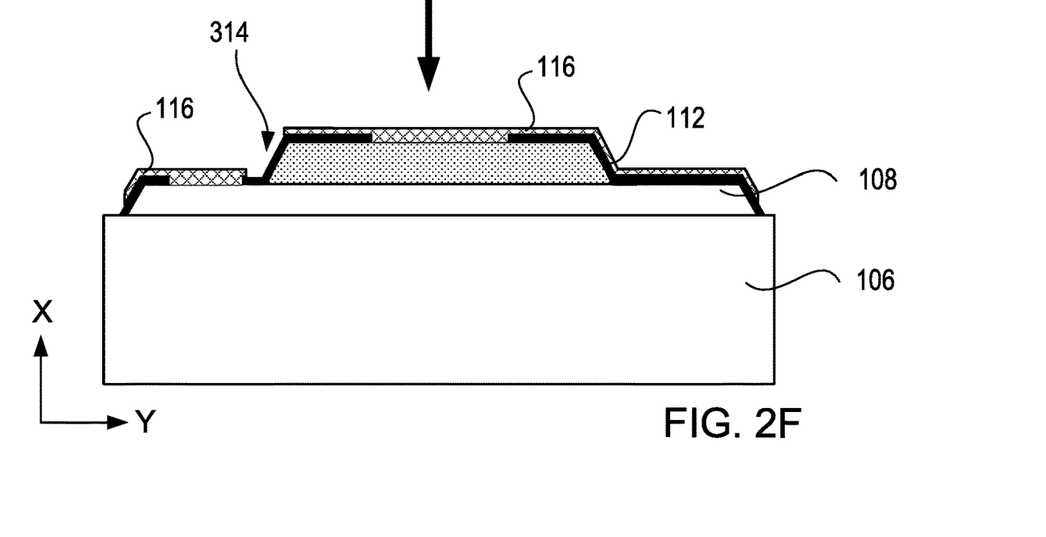

After depositing and patterning the dielectric layer 112, the electrode layers are formed as shown in FIGS. 2E-2F. In some implementations, the electrode layers are formed from metal. In such cases, it is useful to select the metal so that ohmic contacts are formed with the underlying semiconductor material. The particular metal selected may depend on the conductivity type of the underlying semiconductor material. For example, as shown in FIG. 2E, the first semiconductor layer 108 may be a GaAs layer of a first conductivity type (e.g., N-type), whereas the upper layer of the laser diode stack may be a GaAs layer of a second conductivity type (e.g., N-type). Accordingly, a metal 310 formed in the window region 308 to electrically connect to the first semiconductor layer 308 may be different from the metal 312 formed in the window region 306 to electrically connect to the laser diode stack. As an example, for an N-type GaAs layer, the ohmic contact may include a AuGe, Al or TiW layer. For a P-type GaAs layer, the ohmic contact may include a Au, Pt, Ti, Al or TiW layer. Other ohmic contacts for N-type and P-type semiconductor materials are also possible. The thickness of the ohmic contact layers may be, e.g., in the range of about 1 nm to about 100 nm or more.

As shown in FIG. 2F, the upper electrode layer 116 then is deposited and patterned over the surface of the dielectric layer 112. The upper electrode layer 116 may be formed from a metal such as, e.g., gold. The upper electrode layer 116 is patterned using photolithography of a resist layer and an etchant (e.g., a wet etchant) to separate the electrode layer 116 at region 314. This separation ensures that there is not a short circuit extending across the upper surface of each laser diode in the laser diode bar. Although not shown in FIG. 2F, the electrode layer 116 may extend to the cathode of a neighboring laser diode on the substrate formed by the same process disclosed herein. The thickness of the upper electrode layer 116 may be, e.g., in the range of about 100 nm to about 1000 nm or more. The metals for the upper electrode layer 116 may be deposited using physical vapor deposition techniques such as thermal evaporation or electron beam evaporation, though other techniques may be used instead.

Figure 2G:
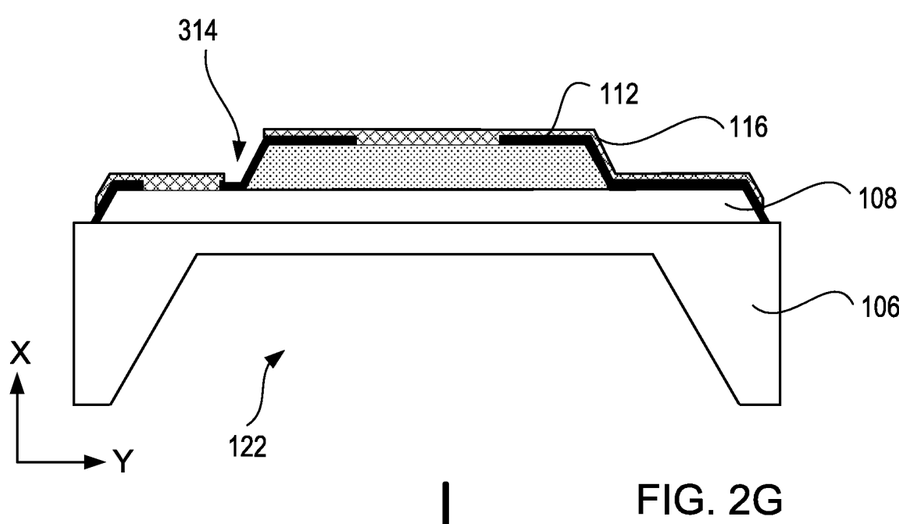
Figure 2H:
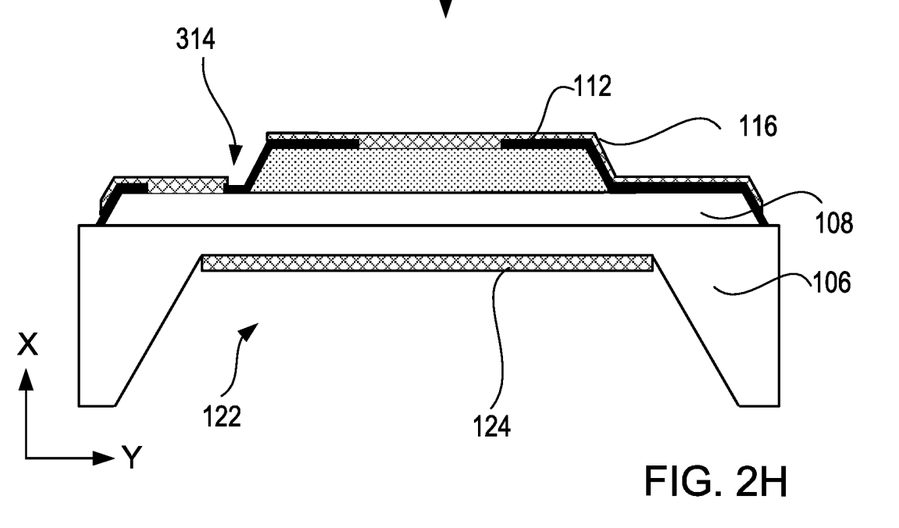

FIGS. 2G-2H illustrate the formation of the optional backside recess and shunt electrode. Prior to performing the backside etch, the front-side laser diodes may be protected using photoresist or other spin-applied polymeric coating that prevents contamination of the front-side circuits. Subsequent to applying the front-side protection, the backside of the substrate may be coated with a patterned resist or hard mask that exposes just those portions of the substrate to be etched. For example, as shown in FIG. 2G, the area 122 etched is located directly underneath the laser diode stack 110. In implementations where the substrate is a semiconductor wafer, it may be useful to use a deep reactive ion etch (DRIE) given that the such dry etches can more easily and effectively remove the thick semiconductor material. The depth of the etch may be set so that it reaches the backside of the first semiconductor layer 108. For example, the etch depth may be 400 microns or more, 500 microns or more, 600 microns or more or 700 microns or more.

Following formation of the backside recess 122, the shunt electrode 124 then is formed within the recess 122, as shown in FIG. 2H. For example, in some implementations, a metal layer, such as gold is deposited within the recess 122. The metal layer may be deposited using physical vapor deposition techniques as described herein to thicknesses in the range of about 1 nm to 100 nm or more. The metal layer then may be patterned to form the shunt electrode 124. This patterning process may entail, e.g., forming and patterning a resist layer, followed by a wet etch of the exposed portions of the metal layer.

A number of embodiments have been described. Nevertheless, it will be understood that various modifications may be made without departing from the spirit and scope of the invention. For example, though FIG. 1A shows a laser diode bar with only two laser diodes, additional laser diodes may be formed within the laser diode bar including, e.g., 10 laser diodes, 50 laser diodes, 100 laser diodes, or more, in which the laser diodes are connected in series using the techniques disclosed herein. Furthermore, though the laser diode stacks are shown constructed using the SCH design, other laser diode configurations are also possible. Furthermore, the materials and layers of the laser diodes of the present disclosure are not limited to, among other things, the thicknesses specified herein and/or the materials and/or conductivity type specified herein. Other embodiments are within the scope of the following claims.

What is claimed is:

1. A laser diode bar comprising:
   a semiconductor substrate comprising a first semiconductor layer of a first conductivity type on a front side of the semiconductor substrate;
   a first laser diode stack on a front side of the first semiconductor layer;
   a second laser diode stack on the front side of the first semiconductor layer, the second laser diode stack being electrically connected in series with the first laser diode stack,
   wherein each of the first laser diode stack and the second laser diode stack comprises one or more first semiconductor cladding layers of the first conductivity type, and
   wherein an electrical conductivity of the first semiconductor layer of the first conductivity type is higher than an electrical conductivity of each semiconductor cladding layer of the first conductivity type;
   a first electrode layer on the first laser diode stack, wherein the first electrode layer electrically connects the first laser diode stack to a portion of the first semiconductor layer of the first conductivity type that is between the first laser diode stack and the second laser diode stack;
   a first recess in a back side of the semiconductor substrate and underneath the first laser diode stack; and
   a shunt electrode layer on the back side of the first semiconductor layer of the first conductivity type and directly underneath the first laser diode stack.

2. The laser diode bar of claim 1, comprising:
   a trench between the first laser diode stack and the second laser diode stack; and
   a dielectric layer on both the first laser diode stack and the second laser diode stack, the dielectric layer extending into the trench,
   wherein the first electrode layer electrically connects to the first laser diode stack through a first opening in the dielectric layer, and electrically connects to the first semiconductor layer of the first conductivity type through a second opening in the dielectric layer.

3. The laser diode bar of claim 2, wherein the trench extends into the first semiconductor layer of the first conductivity type.

4. The laser diode bar of claim 3, wherein the semiconductor substrate comprises a semi-insulating semiconductor region beneath the first semiconductor layer of the first conductivity type, and the trench extends into the semi-insulating semiconductor region.

5. The laser diode bar of claim 1, wherein the first electrode layer comprises an ohmic contact with the first laser diode stack and an ohmic contact with the first semiconductor layer of the first conductivity type.

6. The laser diode bar of claim 1, wherein the first semiconductor layer of the first conductivity type and each layer within each semiconductor cladding region are doped with a first dopant type, and wherein a concentration of the first dopant type in the first semiconductor layer is greater than a concentration of the first dopant type in each layer of each semiconductor cladding region.

7. The laser diode bar of claim 6, wherein the concentration of the first dopant type in the first semiconductor layer is greater than $1*10^{18}$ cm$^{-3}$.

8. The laser diode bar of claim 1, wherein a series electrical resistance of the first semiconductor layer between the first electrode layer and the second laser diode stack and is less than 10 milli-ohms.

9. The laser diode bar of claim 1, wherein the first electrode layer electrically connects an anode of the first laser diode stack to a cathode of the second laser diode stack.

10. The laser diode bar of claim 1, wherein each laser diode stack comprises:
    a second semiconductor cladding layer of a second conductivity type; and
    a semiconductor active region for generating photons, wherein the semiconductor active region is between the one or more first semiconductor cladding layers of the first conductivity type and the second semiconductor cladding layer of the second conductivity type, and
    wherein the first electrode layer is on and electrically connects to the second semiconductor cladding layer in the first laser diode stack.

11. The laser diode bar of claim 1, wherein the shunt electrode layer is within the first recess.

12. The laser diode bar of claim 11, wherein the first recess extends from the back side of the semiconductor substrate to the back side of the first semiconductor layer.

13. The laser diode bar of claim 1, comprising a second electrode layer in direct physical and electrical contact with the front side of the first semiconductor layer of the first conductivity type, wherein at least a portion of the shunt electrode layer is directly beneath the second electrode layer.

14. The laser diode bar of claim 13, comprising a dielectric layer extending over a sidewall of the first laser diode stack, wherein the dielectric layer is between the first laser diode stack and the second electrode layer.

15. The laser diode bar of claim 13, wherein the second electrode layer provides an ohmic contact with the front side of the first semiconductor layer of the first conductivity type.

16. A method of fabricating a laser diode bar, the method comprising:
    providing a semiconductor substrate;
    forming a first semiconductor layer of a first conductivity type on a front side of the semiconductor substrate;

forming a semiconductor stack on a front side of the first semiconductor layer, wherein the semiconductor stack comprises at least one first semiconductor cladding layer of the first conductivity type on the first semiconductor layer, and wherein an electrical conductivity of the first semiconductor layer is greater than an electrical conductivity of each first semiconductor cladding layer;

forming a trench in the semiconductor stack down to the first semiconductor layer to divide the semiconductor stack into a first laser diode stack and a second laser diode stack;

forming a first electrode layer on the first laser diode stack and on the first semiconductor layer in the trench to establish a series connection between the first laser diode stack and the second laser diode stack; and forming a recess on a back side of the semiconductor substrate and directly beneath the first laser diode stack, wherein the recess extends from the back side of the semiconductor substrate to a back side of the first semiconductor layer.

17. The method of claim 16, wherein the first semiconductor layer of the first conductivity type and each layer within each semiconductor cladding region are doped with a first dopant type, and wherein a concentration of the first dopant type in the first semiconductor layer is greater than a concentration of the first dopant type in each layer of each semiconductor cladding region.

18. The method of claim 17, wherein the concentration of the first dopant type in the first semiconductor layer is greater than $1*10^{18}$ cm$^{-3}$.

19. The method of claim 17, wherein a series electrical resistance of the first semiconductor layer between the first laser diode stack and an electrical contact layer is less than 10 milli-ohms.

20. The method of claim 16, comprising:
forming a dielectric layer on the first laser diode stack and on the first semiconductor layer in the trench prior to forming the first electrode layer; and
forming a first opening in the dielectric layer to expose the first laser diode stack; and
forming a second opening in the dielectric layer to expose the first semiconductor layer in the trench,
wherein forming the first electrode layer comprises forming the first electrode layer in the first opening and in the second opening.

21. The method of claim 16, wherein the trench extends into the semiconductor substrate.

22. The method of claim 16, wherein the semiconductor stack comprises:

a semiconductor active region for generating photons on the at least one first semiconductor cladding layer; and
at least one second semiconductor cladding layer of a second conductivity type on the semiconductor active region.

23. The method of claim 16, comprising forming the a shunt electrode layer in the recess.

24. The method of claim 23, comprising forming a third electrode layer in direct physical and electrical contact with the front side of the first semiconductor layer of the first conductivity type, wherein at least a portion of the shunt electrode layer is directly beneath the third electrode layer.

25. A laser diode bar comprising:
a semiconductor substrate comprising a first semiconductor layer of a first conductivity type;
a plurality of additional semiconductor layers on an upper surface of the first semiconductor layer, the plurality of additional semiconductor layers comprising a first cladding layer of the first conductivity type, an active region for generating photons, and a second cladding layer of a second conductivity type;
a plurality of trenches in the plurality of additional semiconductor layers and separating the plurality of additional semiconductor layers into a plurality of laser diode stacks, wherein the first semiconductor layer is a common cathode contact for each laser diode stack;
a plurality of electrically insulating barriers, wherein each electrically insulating barrier is positioned in the first semiconductor layer between a different pair of laser diode stacks, wherein the plurality of laser diode stacks are serially electrically connected; and
a plurality of shunt electrode layers on a back side of the semiconductor substrate, wherein each shunt electrode layer of the plurality of shunt electrode layers is positioned underneath a corresponding laser diode stack of the plurality of laser diode stacks.

26. The laser diode bar of claim 25, wherein each trench comprises a first depth extending from an upper surface of the plurality of additional semiconductor layers to the upper surface of the first semiconductor layer and a second depth extending from the upper surface of the plurality of additional semiconductor layers into the semiconductor substrate.

27. The laser diode bar of claim 25, further comprising a plurality of dielectric layers, each dielectric layer arranged on the upper surface of a corresponding laser diode stack;
a contact opening in each dielectric layer; and
a plurality of laser diode anode contacts, wherein each anode contact is positioned in a corresponding contact opening.

* * * * *